(12) United States Patent
Li et al.

(10) Patent No.: US 10,572,042 B2
(45) Date of Patent: Feb. 25, 2020

(54) IN CELL TOUCH PANEL, DRIVING METHOD THEREOF, AND DISPLAY DEVICE

(71) Applicant: BOE TECHNOLOGY GROUP CO., LTD., Beijing (CN)

(72) Inventors: Changfeng Li, Beijing (CN); Xue Dong, Beijing (CN); Haisheng Wang, Beijing (CN); Chunwei Wu, Beijing (CN); Yingming Liu, Beijing (CN); Rui Xu, Beijing (CN); Pengpeng Wang, Beijing (CN); Wei Liu, Beijing (CN); Lijun Zhao, Beijing (CN); Yanan Jia, Beijing (CN); Yanling Han, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/563,586

(22) PCT Filed: May 9, 2017

(86) PCT No.: PCT/CN2017/083566
§ 371 (c)(1),
(2) Date: Sep. 30, 2017

(87) PCT Pub. No.: WO2018/010477
PCT Pub. Date: Jan. 18, 2018

(65) Prior Publication Data
US 2018/0348924 A1 Dec. 6, 2018

(30) Foreign Application Priority Data
Jul. 15, 2016 (CN) .......................... 2016 1 0561417

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC .................. G06F 3/0412; G06F 3/044; G06F 2203/04103; G06F 2203/04804;
(Continued)

(56) References Cited

U.S. PATENT DOCUMENTS 9,574,757 B2 * 2/2017 Omata .................... G06F 3/044
2004/0238726 A1 * 12/2004 Caldwell ............... A47B 57/00
250/221
(Continued)

FOREIGN PATENT DOCUMENTS

CN 103050506 A 4/2013
CN 103984442 A 8/2014
(Continued)

OTHER PUBLICATIONS

Search Report for International Chinese Patent Application No. PCT/CN2017/083566 dated Jun. 29, 2017.
(Continued)

*Primary Examiner* — Hong Zhou
(74) *Attorney, Agent, or Firm* — Calfee, Halter & Griswold LLP

(57) ABSTRACT

An in cell touch panel, a driving method thereof and a display device are disclosed. The in cell touch panel includes a substrate, an organic light emitting structure on the substrate, and a package protection layer coating said organic light emitting structure. The in cell touch panel further
(Continued)

includes a touch electrode structure disposed between the substrate and the package protection layer and coated by the package protection layer; and a connecting terminal disposed on the substrate and coated by the package protection layer. The connecting terminal is electrically connected to a touch electrode in the touch electrode structure.

20 Claims, 4 Drawing Sheets

(51) Int. Cl.
*H01L 27/32* (2006.01)
*H01L 51/52* (2006.01)
*G09G 3/3225* (2016.01)

(52) U.S. Cl.
CPC .............................. *H01L 51/5253* (2013.01); *G06F 2203/04111* (2013.01); *G09G 3/3225* (2013.01); *H01L 27/323* (2013.01); *H01L 2251/303* (2013.01)

(58) Field of Classification Search
CPC ......... G06F 2203/04107; H01L 27/323; H01L 27/3276; H01L 51/5253; H01L 51/56; H01L 27/3258; H01L 27/3262; G02F 1/13338; G02F 1/133512; G02F 1/134309; G02F 1/134363; G02F 2201/121
See application file for complete search history.

(56) References Cited

U.S. PATENT DOCUMENTS

| | | | | |
|---|---|---|---|---|
| 2010/0276818 | A1* | 11/2010 | Maindron | H01L 51/5253 257/789 |
| 2012/0249465 | A1* | 10/2012 | Lin | G06F 3/041 345/173 |
| 2013/0293499 | A1* | 11/2013 | Chang | G06F 3/041 345/173 |
| 2014/0313438 | A1* | 10/2014 | Jun | G06F 3/044 349/12 |
| 2015/0162387 | A1* | 6/2015 | Gu | G06F 3/0412 345/174 |
| 2016/0132148 | A1* | 5/2016 | Han | G06F 3/044 345/174 |
| 2016/0132155 | A1* | 5/2016 | Lee | G06F 3/044 345/174 |
| 2016/0202812 | A1* | 7/2016 | Pyoun | G06F 3/0412 345/173 |
| 2017/0108971 | A1 | 4/2017 | Yang et al. | |
| 2017/0160847 | A1 | 6/2017 | Huo | |
| 2017/0220150 | A1 | 8/2017 | Wu | |

FOREIGN PATENT DOCUMENTS

| | | |
|---|---|---|
| CN | 105278748 A | 1/2016 |
| CN | 105373282 A | 3/2016 |
| CN | 105552106 A | 5/2016 |
| CN | 106201142 A | 12/2016 |
| KR | 20160028430 A | 3/2016 |

OTHER PUBLICATIONS

First Office Action for Chinese Patent Application No. 201610561417.4 dated Oct. 10, 2017.

Second Office Action for Chinese Patent Application No. 201610561417.4 dated Apr. 10, 2018.

* cited by examiner

US 10,572,042 B2

IN CELL TOUCH PANEL, DRIVING METHOD THEREOF, AND DISPLAY DEVICE

RELATED APPLICATION

The present application is the U.S. national phase entry of PCT/CN2017/083566, with an international filing date of May 9, 2017, which claims the benefit of Chinese Patent Application No. 201610561417.4, filed on Jul. 15, 2016, the entire disclosures of which are incorporated herein by reference.

TECHNICAL FIELD

The present disclosure relates to the field of display technology, in particular to an in cell touch panel, a driving method thereof as well as a display device.

BACKGROUND

Organic Light Emitting Diode (OLED) display screen is one of the hotspots in the field of flat panel display research. Compared to the liquid crystal display screen, the OLED display screen has such advantages as low energy consumption, low manufacturing cost, self-luminescence, wide viewing angle and fast responding speed. In the field of displays for mobile phones, PDAs, digital cameras, etc., the OLED display screen has begun to take the place of the conventional liquid crystal display screen.

With the fleeting progress of display technologies, touch screen panels have been widely used in people's lives. Touch screen panels can be divided into add on mode touch panels, on cell touch panels and in cell touch panels in terms of the structure.

As shown in FIG. 1, in the OLED touch display devices that are currently on the market, the touch function components are of an add on structure, namely, after manufacturing a OLED display panel 01, a touch function component 02 is additionally attached to the display panel 01 to realize the touch function. Thus existing OLED touch display devices have such disadvantages as high manufacturing cost, low light transmittance, and thick module. Besides, as shown in FIG. 1, the touch function component 02 is above the display panel 01, and a touch electrode in the touch function component 02 usually needs to be connected to a connecting terminal 03 external to the display panel 01. The connecting terminal 03 is also electrically connected to a touch chip external to the display panel so as to realize electrical connection between the touch electrode in the touch function component 02 and the touch chip. Therefore, the existing OLED touch display device also has the disadvantage of wide frame.

SUMMARY

Therefore, it is desirable to not only reduce the thickness and frame width of the touch panel, but also reduce the cost.

According to an aspect, an embodiment of the present disclosure provides an in cell touch panel, which comprises: a substrate, an organic light emitting structure on the substrate, and a package protection layer coating said organic light emitting structure. Said in cell touch panel further comprises: a touch electrode structure disposed between the substrate and the package protection layer and coated by the package protection layer; and a connecting terminal disposed on the substrate and coated by the package protection layer. Said connecting terminal is electrically connected to a touch electrode in the touch electrode structure.

According to another embodiment, the touch electrode structure is between the organic light emitting structure and the package protection layer, and, an insulating layer is disposed between the touch electrode structure and the organic light emitting structure.

According to another embodiment, a touch electrode in the touch electrode structure is electrically connected to the connecting terminal through an via hole penetrating the insulating layer.

According to another embodiment, a flat layer is also disposed between the insulating layer and the touch electrode structure.

According to another embodiment, the touch electrode structure comprises a touch sensing electrode and a touch driving electrode insulated from each other.

According to another embodiment, the touch electrode structure comprises a plurality of self-capacitive electrodes insulated from one another, and a plurality of wires correspondingly connected to said plurality of self-capacitive electrodes.

According to another embodiment, the organic light emitting structure comprises an anode layer, a light-emitting layer and a cathode layer that are stacked up, and the touch electrode structure comprises a first touch electrode, and the anode layer or cathode layer is multiplexed as a second touch electrode.

According to another embodiment, the first touch electrode is a touch sensing electrode, and the second touch electrode is a touch driving electrode.

According to another embodiment, the first touch electrode is a touch driving electrode, and the second touch electrode is a touch sensing electrode.

According to another embodiment, the organic light emitting structure comprises an anode layer, a light-emitting layer and a cathode layer that are stacked up, and the touch electrode structure comprises a touch sensing electrode and a touch driving electrode.

According to another embodiment, the anode layer is multiplexed as the touch sensing electrode and the cathode layer is multiplexed as the touch driving electrode.

According to another embodiment, the cathode layer is multiplexed as the touch sensing electrode and the anode layer is multiplexed as the touch driving electrode.

According to another embodiment, the organic light emitting structure comprises an anode layer, a light-emitting layer and a cathode layer that are stacked up, and the touch electrode structure comprises a plurality of self-capacitive electrodes insulated from one another and a plurality of wires correspondingly connected to said plurality of self-capacitive electrodes. Moreover, the anode layer or cathode layer is multiplexed as a self-capacitive electrode.

According to another embodiment, the insulating layer is used for blocking water and oxygen, and for coating the organic light emitting structure.

According to another embodiment, the insulating layer is formed by atomic deposition.

According to another embodiment, the insulating layer is made of alumina.

According to another aspect, an embodiment of the present disclosure further provides a driving method for any of the above described in cell touch panels, said in cell touch panel being driven in a time-sharing manner in a period of one frame. Said method comprises: displaying by controlling the organic light emitting structure to emit light in a display phase; and determining a touch position by controlling the touch electrode structure in a touch phase.

According to still another aspect, an embodiment of the present disclosure further provides a display device, comprising any of the above described in cell touch panels.

BRIEF DESCRIPTION OF THE DRAWINGS

FIG. 2b is a top view of the in cell touch panel as shown in FIG. 2a;

DETAILED DESCRIPTION

Figure 1:
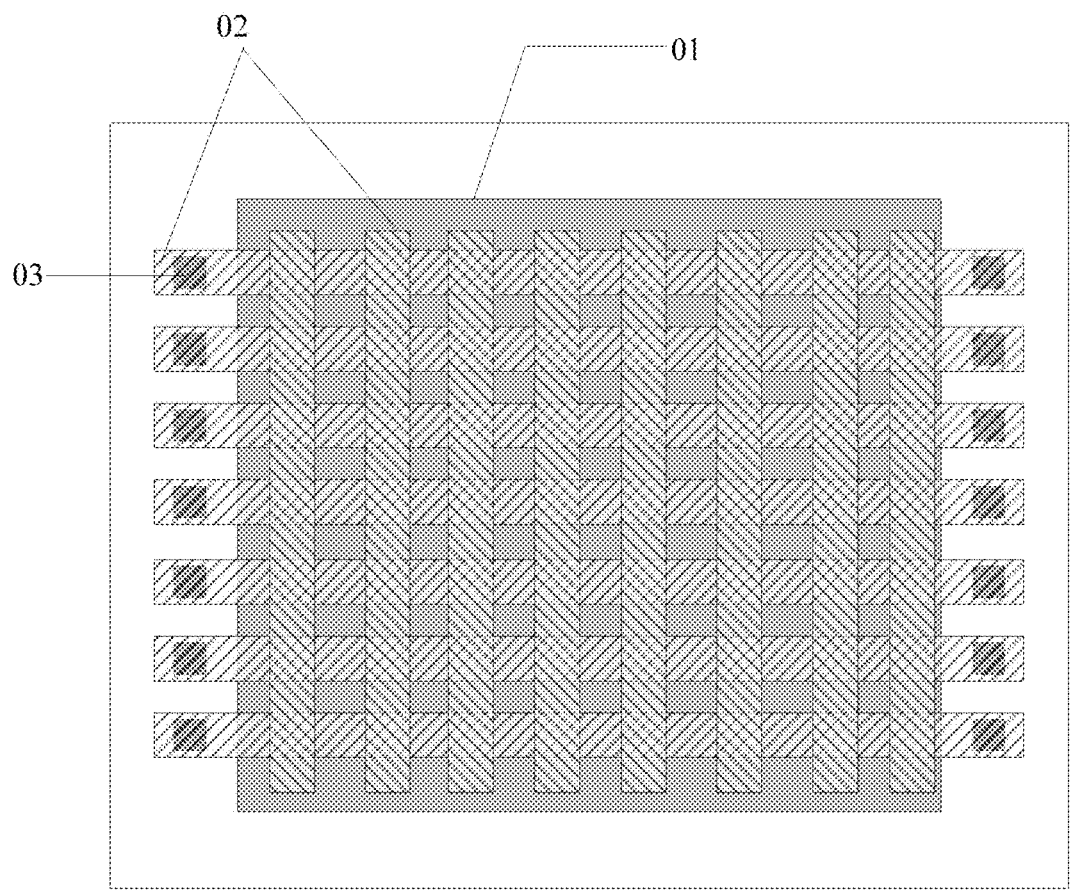
FIG. 1 is a top view of an existing OLED touch display device.

In order to make the object, technical solution and advantages of the present disclosure clearer, the in cell touch panel and its driving method as well as the display device provided in the embodiments of the present disclosure will be described in further detail below with reference to the drawings.

The shapes and sizes of respective film layers in the drawings do not reflect a true proportion of the in cell touch panel, but they merely schematically illustrate local structures of the in cell touch panel, and they only intend to schematically illustrate the present disclosure.

Figure 2A:
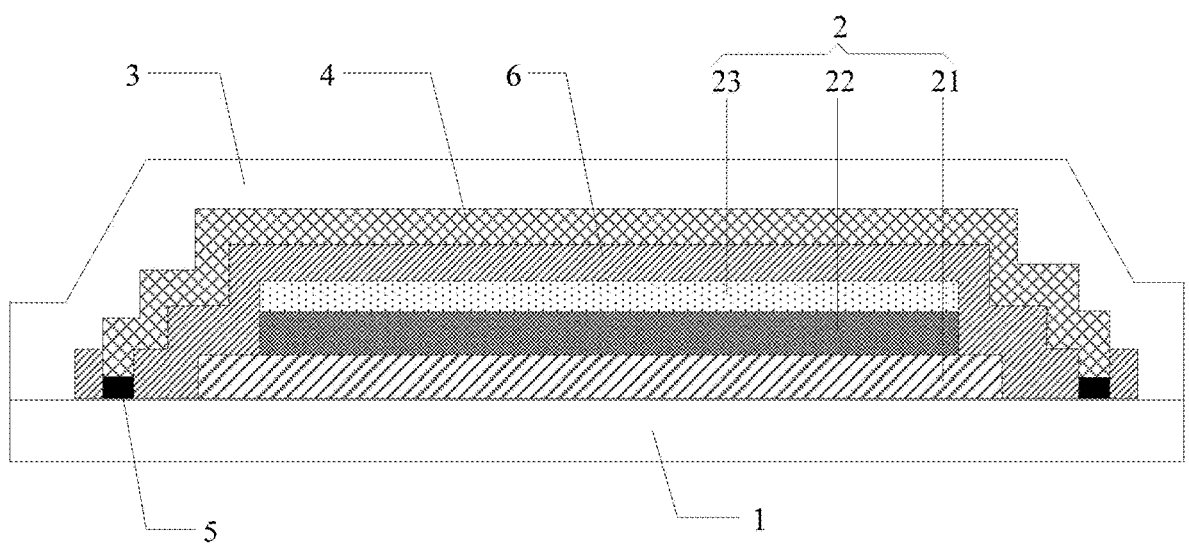
FIG. 2a is one of the structural diagrams of an in cell touch panel provided in an embodiment of the present disclosure.
Figure 2B:
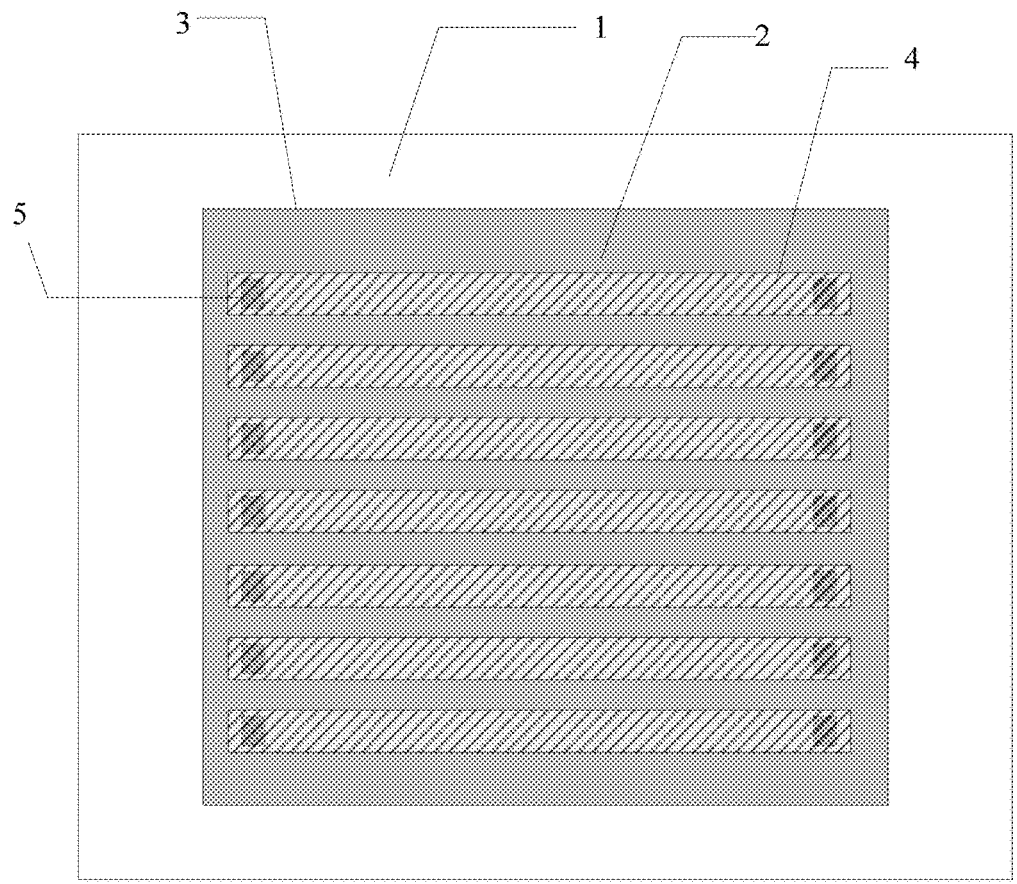

An in cell touch panel is provided in an embodiment of the present disclosure, as shown in FIGS. 2a and 2b. FIG. 2b is a top view of FIG. 2a. Said in cell touch panel comprises: a substrate 1, an organic light emitting structure 2 on the substrate 1, and a package protection layer 3 coating said organic light emitting structure 2. Said in cell touch panel further comprises: a touch electrode structure 4 disposed between the substrate 1 and the package protection layer 3 and coated by the package protection layer 3; and a connecting terminal 5 disposed on the substrate 1 and coated by the package protection layer 3. Said connecting terminal 5 is electrically connected to the touch electrode in the touch electrode structure 4. In addition, the connecting terminal 5 can also be electrically connected to a touch chip (not shown in the figures), so that a touch electrode in the touch electrode structure 4 is electrically connected to the touch chip.

In said in cell touch panel provided by the embodiment of the present disclosure, the touch electrode structure is embedded in the package protection layer, that is, the package protection layer functions as a protection layer for both the organic light emitting structure and the touch electrode structure. Thus compared to add on mode touch panels, a separately arranged protection layer for the touch electrode structure is omitted. As a result, the thickness of the touch panel can be reduced and the cost can be reduced as well. In addition, both the connecting terminal and the touch electrode structure are embedded in the package protection layer, that is, the connecting terminal can be arranged in an area for peripheral wires in the package protection layer. Therefore, the frame width can be reduced as compared to the arrangement of the connecting terminal external to the protection layer in the existing add on mode touch panels.

Figure 3:
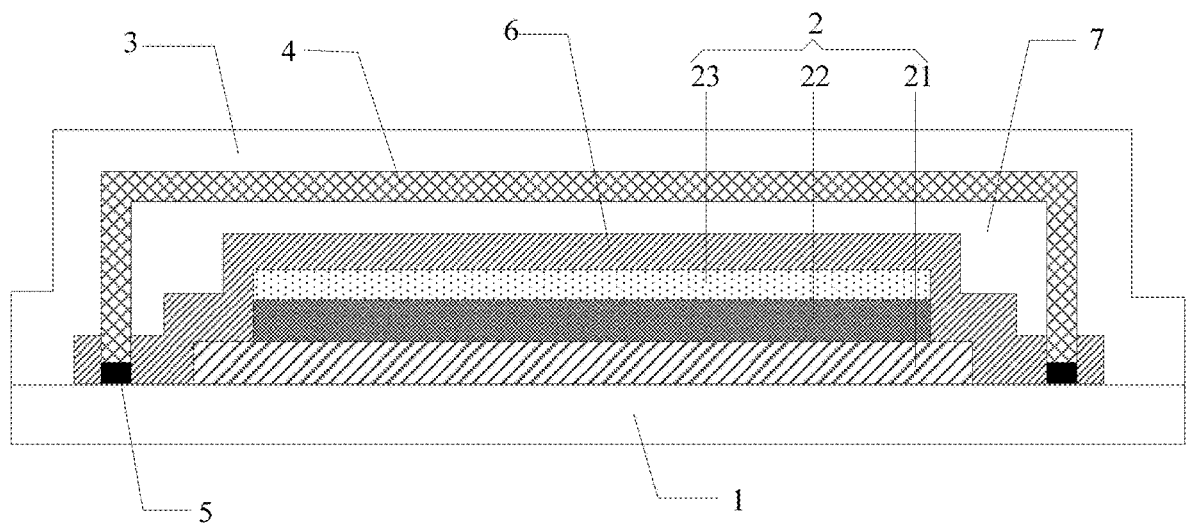
FIG. 3 is another structural diagram of the in cell touch panel provided in the embodiment of the present disclosure.

The closer the touch electrode structure to the package protection layer, the higher is the touch sensitivity, so according to another embodiment, as shown in FIG. 3, the touch electrode structure 4 is disposed between the organic light emitting structure 2 and the package protection layer 3.

Since an anode layer, a light-emitting layer and a cathode layer are provided in the organic light emitting structure, short-circuit might occur between the touch electrode structure and the cathode layer or anode layer in the organic light emitting structure, thus as shown in FIG. 2a, an insulating layer 6 may also be provided between the touch electrode structure 4 and the organic light emitting structure 2.

As shown in FIG. 2a, the organic light emitting structure 2 may comprise an anode layer 21, a light-emitting layer 22 and a cathode layer 23 that are stacked up. Light emission of the organic light emitting structure 2 is realized by electrons of the cathode layer 23 complexing with cavities of the anode layer 21 in the light-emitting layer 22 so as to excite an organic material in the light-emitting layer 22 to emit light. Generally speaking, the organic material for forming the light-emitting layer 22 and an active metal for forming the cathode layer 23 in the organic light emitting structure 2 are very sensitive to water vapor and oxygen. If water vapor and oxygen permeate inside the touch panel from the surroundings, the metal of the cathode layer 23 will be oxidized and the organic material of the light-emitting layer 22 will deteriorate, so that the service life of the organic light emitting structure 2 will be shortened or the organic light emitting structure will be fatally damaged to affect use thereof. Therefore, according to another embodiment, as shown in FIG. 2a, the insulating layer 6 is used for blocking water and oxygen and for coating the organic light emitting structure 2, such that the organic light emitting structure can be further protected without increasing thickness of the touch panel.

According to another embodiment, in order to improve water blocking performance of the insulating layer, the insulating layer is formed by atomic deposition.

According to another embodiment, the insulating layer can be made of alumina ($Al_2O_3$). Of course, the insulating layer can be made of other materials, such as silicon nitride ($SiN_x$), that are both insulating and water blocking, which is not limited herein.

According to another embodiment, in order to reduce the frame width, as shown in FIGS. 2a and 3, the touch electrode structure 4 can be electrically connected to the connecting terminal 5 through an via hole penetrating the insulating layer 6.

In addition, gaps might appear in the organic light emitting structure, so the insulating layer usually does not have a flat surface. Therefore, according to another embodiment, as shown in FIG. 3, a flat layer 7 is also disposed between the insulating layer 6 and the touch electrode structure 4.

The flat layer can be made of, for example, silicon carbon nitride (SiCN). The flat layer can also be made of other materials, which is not limited herein.

The flat layer can be made by a printing process. But of course, it can also be made by other processes, which is not limited herein.

Figure 4:
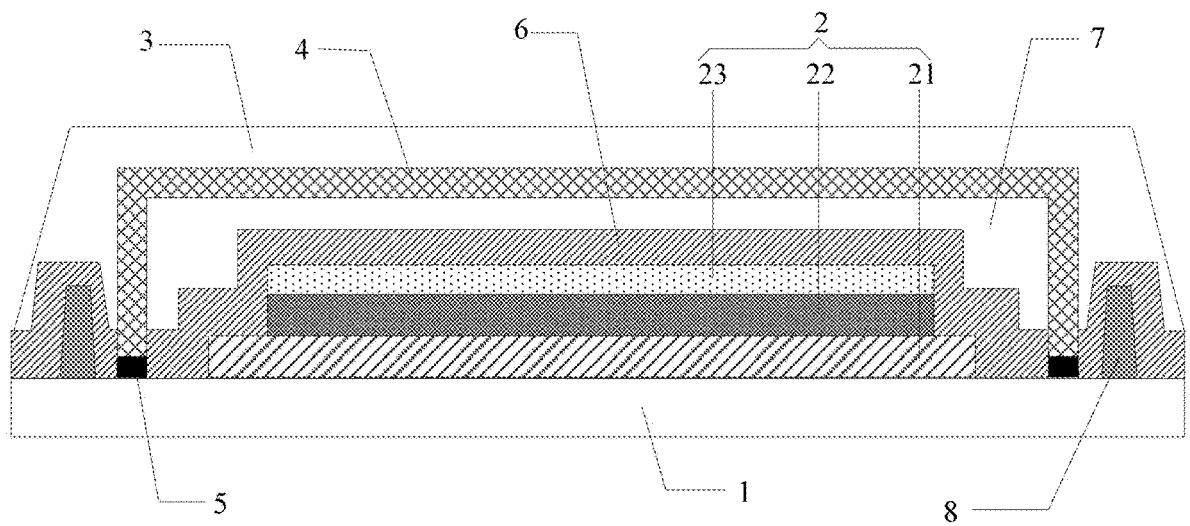
FIG. 4 is still another structural diagram of the in cell touch panel provided in the embodiment of the present disclosure.

According to another embodiment, the substrate has a display area and a frame area. The display area is provided with an organic light emitting structure, while the frame area is provided with the connecting terminal and some peripheral wiring, etc. In order to improve water blocking performance, as shown in FIG. 4, the in cell touch panel further comprises a barrier dam 8 provided in the frame area and surrounding the display area, which is also covered by the package protection layer 3. The specific structure of the barrier dam 8 is the same as that of the existing organic light emitting display panel, so it will not be elaborated herein.

The substrate can be a glass substrate or a flexible substrate, which is not limited herein.

When the substrate is a glass substrate, packaging may be realized by means of a glass cover plate, i.e. the package protection layer is package glass. When the substrate is a flexible substrate, packaging may be realized by means of a thin film, i.e. the package protection layer is a package thin film. The package protection layer is, for example, used for blocking water and oxygen.

When the package protection layer is a package thin film, the package protection layer can be made of such material as silicon nitride ($SiN_x$). The package protection layer can also be made of other materials, which is not limited herein.

The package protection layer can be made by a printing process or by chemical vapor deposition, which is not limited herein.

Several thin film transistors may also be disposed between the substrate and the organic light emitting structure for providing signals to the organic light emitting structure, but this is not elaborated herein.

The in cell touch panel provided in the embodiment of the present disclosure can be either a self-capacitive touch panel or a mutual capacitive touch panel, which is not limited herein. Embodiments are given below for illustration.

According to an embodiment of the present disclosure, the in cell touch panel is a mutual capacitive touch panel.

First type: the touch electrode structure comprises a touch sensing electrode and a touch driving electrode insulated from each other.

The touch electrode structure can, for example, be located between the organic light emitting structure and the package protection layer.

During implementation, the touch sensing electrode and the touch driving electrode can be arranged at the same layer or at different layers, which is not limited herein.

Second type: the organic light emitting structure comprises an anode layer, a light-emitting layer and a cathode layer that are stacked up. The touch electrode structure comprises a first touch electrode, and the anode layer or cathode layer is multiplexed as a second touch electrode. Thus the thickness and cost of the touch panel are reduced.

The first touch electrode can, for example, be located between the organic light emitting structure and the package protection layer.

The first touch electrode is a touch sensing electrode and the second touch electrode is a touch driving electrode; or the first touch electrode is a touch driving electrode and the second touch electrode is a touch sensing electrode.

The closer the touch sensing electrode is to the package protection layer, the higher is the touch sensitivity of the touch panel, so the first touch electrode can be a touch sensing electrode.

Third type: the organic light emitting structure comprises an anode layer, a light-emitting layer and a cathode layer that are stacked up. The touch electrode structure comprises a touch sensing electrode and a touch driving electrode. The anode layer is multiplexed as the touch sensing electrode and the cathode layer is multiplexed as the touch driving electrode; or the anode layer is multiplexed as the touch driving electrode and the cathode layer is multiplexed as the touch sensing electrode.

By means of the third type of structure as described above, the thickness and cost of the touch panel are further reduced.

For the various in cell touch panels provided in the above embodiments of the present disclosure, density of the touch sensing electrodes and the touch driving electrodes can be set according to the actually required touch accuracy. Higher density of the touch sensing electrodes and the touch driving electrodes means higher touch accuracy. When the touch accuracy reaches a certain degree, fingerprint identification can be realized.

According to another embodiment of the present disclosure, the in cell touch panel is a self-capacitive touch panel First type: the touch electrode structure is placed between the organic light emitting structure and the package protection layer; the touch electrode structure comprises a plurality of self-capacitive electrodes insulated from one another, and a plurality of wires correspondingly connected to the plurality of self-capacitive electrodes.

Second type: the organic light emitting structure comprises an anode layer, a light-emitting layer and a cathode layer that are stacked up. The touch electrode structure comprises a plurality of self-capacitive electrodes insulated from one another, and a plurality of wires correspondingly connected to the plurality of self-capacitive electrodes. Moreover, the anode layer or cathode layer is multiplexed as the self-capacitive electrode. Thus the thickness and cost of the touch panel are reduced.

For the various in cell touch panels provided in the above embodiments of the present disclosure, density of and area occupied by the touch electrodes can be set according to the required touch density. For example, the self-capacitive electrode can be designed as a square electrode of about 5 mm*5 mm. Since the display density of a touch panel is generally in micron level, one self-capacitive electrode usually corresponds to a plurality of organic light emitting structure in the touch panel.

In the above described in cell touch panels provided by the embodiments of the present disclosure, when the touch electrode structure is between the package protection layer and the organic light emitting structure, in order to ensure the transmittance of light, the material of the touch electrodes in the touch electrode structure can be, for example, a transparent conductive material. Of course, the touch electrodes can also be made of other materials, which is not limited herein.

A method for manufacturing the in cell touch panel as provided in the embodiment of the present disclosure will be described below by using the example that the touch electrode structure comprises a touch sensing electrode and the cathode layer of the organic light emitting structure is multiplexed as a touch driving electrode.

Said method for manufacturing the in cell touch panel may include the following steps:

(1) Forming an organic light emitting structure and a connecting terminal on a substrate, the organic light emitting structure comprising an anode layer, a light-emitting layer and a cathode layer that are located on the substrate in order, and the cathode layer being multiplexed as a touch driving electrode;

(2) Forming an insulating layer coating the organic light emitting structure by means of atomic deposition, and forming a via hole at an area of the insulating layer corresponding to the connecting terminal using a mask;

(3) Forming a flat layer above the insulating layer using a printing process;

(4) Forming a touch sensing electrode on the flat layer by the printing process, said touch sensing electrode being electrically connected to the connecting terminal through said via hole;

(5) Forming a package protection layer coating the touch sensing electrode, the connecting terminal and the organic light emitting structure by means of the printing process or chemical vapor deposition.

Methods for manufacturing the in cell touch panels having other structures as provided in the embodiments of the present disclosure are similar to the above manufacturing method in principle, so they will not be elaborated herein.

On the basis of the same inventive concept, an embodiment of the present disclosure further provides a method for driving the above described in cell touch panel, wherein the in cell touch panel is driven in a time-sharing manner in a period of one frame. Said method comprises:

displaying by controlling the organic light emitting structure to emit light in a display phase; and determining a touch position by controlling the touch electrode structure in a touch phase.

Specifically, in a period of one frame, the display phase may be preceding the touch phase. But of course, the touch phase may be preceding the display phase, too, which is not limited herein, as long as the sequence of the display phase and the touch phase remains the same in a period of each frame.

Said method as provided in the embodiment of the present disclosure will be described below by using the example that the touch electrode structure comprises a touch sensing electrode and the cathode layer of the organic light emitting structure is multiplexed as a touch driving electrode.

Figure 5:
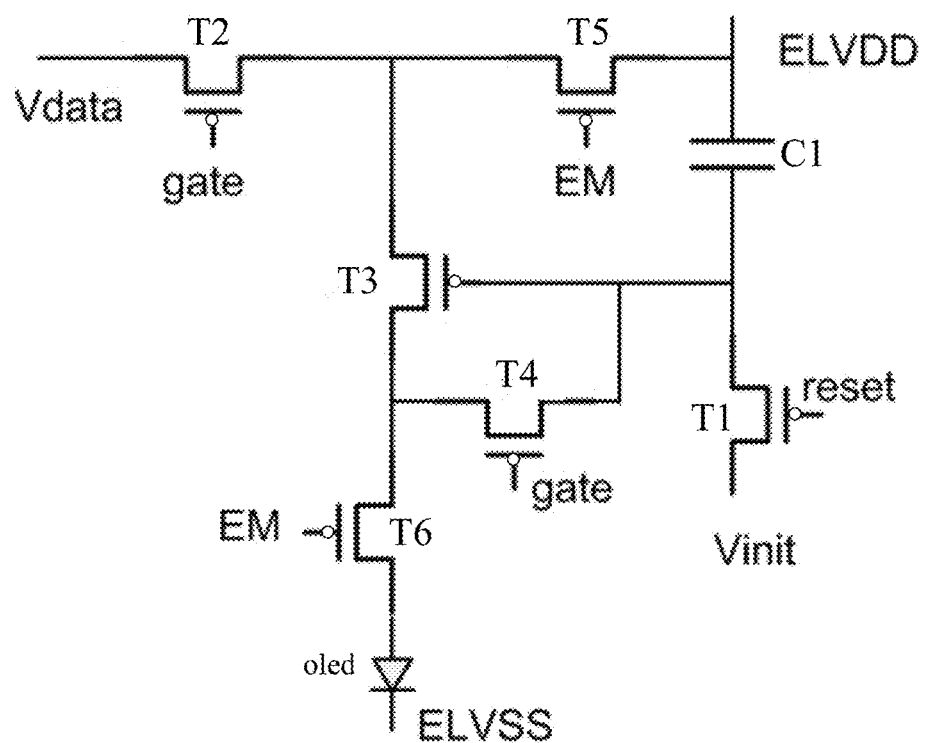
FIG. 5 is a structural diagram of a pixel circuit of the in cell touch panel provided in the embodiment of the present disclosure.
Figure 6:
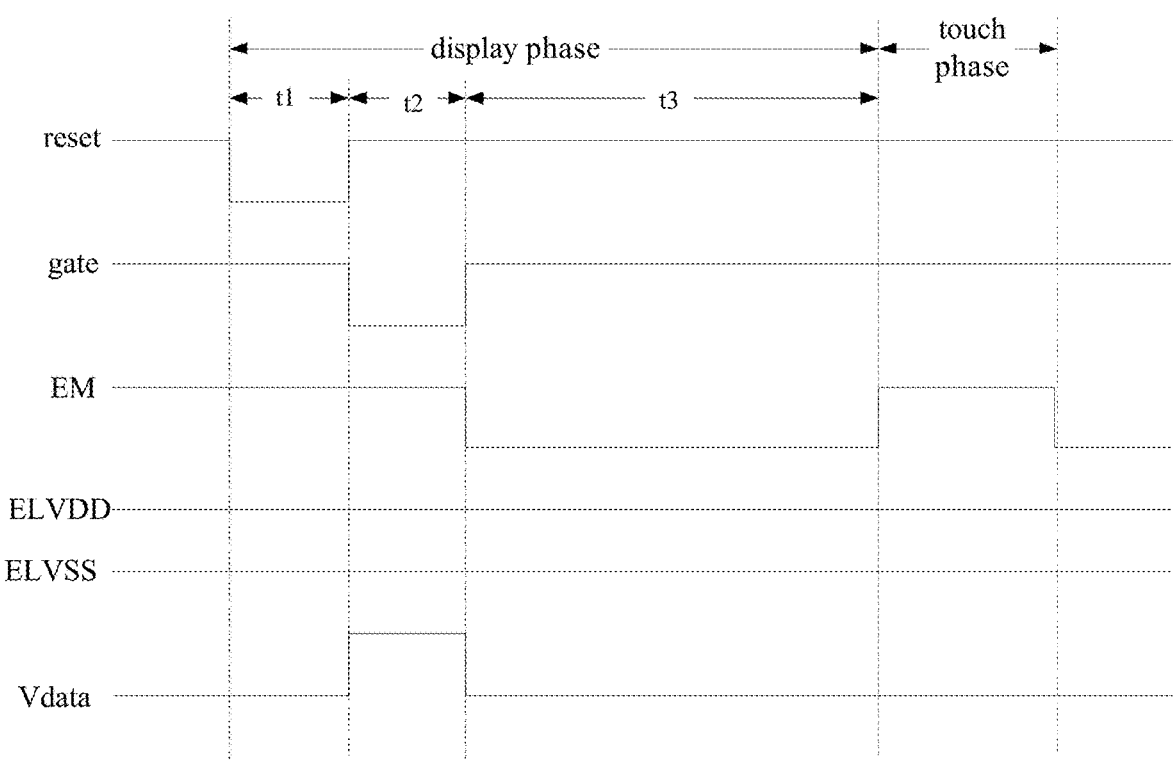
FIG. 6 is a circuit sequence chart corresponding to the pixel circuit as shown in FIG. 5.

During specific implementation, in the display phase, the organic light emitting structure may be controlled by a pixel circuit electrically connected thereto to emit light, so as to realize display. A structure of said pixel circuit is, for example, the same as that of the existing pixel circuit. Take the pixel circuit as shown in FIG. 5 as an example, the pixel circuit includes a data signal terminal Vdata, a light-emitting control terminal EM, a scan signal terminal gate, a initialization signal terminal Vinit, a reset control terminal reset, a cathode signal terminal ELVSS, a power signal terminal ELVDD, six switching transistors T1~T6 and a capacitor C1. The work sequence diagram corresponding to said pixel circuit is as shown by FIG. 6. The display phase includes the three phases of t1, t2 and t3.

At phase t1, a first switching transistor T1 is turned on and the rest transistors are turned off under the control of the reset control terminal reset. The initialization signal terminal Vinit resets the capacitor C1.

At phase t2, the second switching transistor T2, the third switching transistor T3 and the fourth switching transistor T4 are turned on, and the rest switching transistors are turned off under the control of the scan signal terminal gate. The capacitor C1 is charged.

At phase t3, the third switching transistor T3, the fifth switching transistor T5 and the sixth switching transistor T6 are turned on, and the rest switching transistors are turned off under the control of the light-emitting control terminal EM. The organic light emitting structure OLED emits light.

At the touch phase, signals of the light-emitting control terminal EM are pulled up, and the fifth switching transistor T5 and the sixth switching transistor T6 are turned off, so that the organic light emitting structure OLED does not emit light. Meanwhile, driving signals are applied to the cathode layer, i.e. the touch driving electrode, so as to realize touch function.

Since the touch phase in a period of one frame is short, no damage will be caused to the display, and the display device is made to have a touch function thereby. When the touch accuracy is high, fingerprint identification can be realized.

On the basis of the same inventive concept, an embodiment of the present disclosure further provides a display device, comprising the above-mentioned in cell touch panel as provided in the above embodiment of the present disclosure. Since the principle by which said display device solves problems is similar to that of the above-described in cell touch panel, as for implementation of said display device, reference can be made to implementation of the above-described in cell touch panel, and the repetitions will not be reiterated here.

The display device provided in the embodiment of the present disclosure can be any product or component having a display function, such as a mobile phone, a tablet PC, a TV, a monitor, a laptop, a digital photo frame or a navigator, which is not limited herein.

In the in cell touch panel and its driving method as well as the display device provided in the embodiments of the present disclosure, the touch electrode structure is embedded in the package protection layer. That is, the package protection layer functions as a protection layer for both the organic light emitting structure and the touch electrode structure. Thus, compared to add on mode touch panels, a separately arranged protection layer for the touch electrode structure is omitted. As a result, the thickness of the touch panel can be reduced and the cost can be reduced as well. In addition, both the connecting terminal and the touch electrode structure are embedded in the package protection layer, that is, the connecting terminal can be arranged in an area for peripheral wires in the package protection layer. Therefore, the frame width can be reduced as compared to the arrangement of the connecting terminal external to the protection layer in the existing add on mode touch panels.

Apparently, those skilled in the art can make various modifications and variations to the embodiments of the present disclosure without departing from the spirit and scope of the present disclosure. Thus if said modifications and variations to the embodiments of the present disclosure fall into the scope of the claims of the present disclosure and their equivalents, then the present disclosure also intends to include said modifications and variations.

The invention claimed is:

1. An in cell touch panel, comprising: a substrate, an organic light emitting structure on the substrate, and a package protection layer coating said organic light emitting structure, wherein, said in cell touch panel further comprises:

a touch electrode structure disposed between the substrate and the package protection layer and coated by the package protection layer; and a connecting terminal embedded between the package protection layer and the substrate and coated by the package protection layer, wherein, said connecting terminal is in direct contact with the substrate and is electrically connected to a touch electrode in the touch electrode structure;

wherein a projection of the package protection layer on the substrate covers a projection of the connecting terminal on the substrate;

wherein a side of the connecting terminal away from the organic light emitting structure is provided with the package protection layer;

wherein the side of the connecting terminal away from the organic light emitting structure and a side of the connecting terminal close to the organic light emitting structure are provided with an insulating layer, and the insulating layer is in direct contact with the connecting terminal;

wherein a side of the insulating layer away from the connecting terminal and the organic light emitting structure is provided with the package protection layer;

wherein the touch electrode structure is in direct contact with the connecting terminal.

2. The in cell touch panel according to claim 1, wherein the touch electrode structure is between the organic light emitting structure and the package protection layer, and wherein the insulating layer is also disposed between the touch electrode structure and the organic light emitting structure.

3. The in cell touch panel according to claim 2, wherein the touch electrode in the touch electrode structure is electrically connected to the connecting terminal through an via hole penetrating the insulating layer.

4. The in cell touch panel according to claim 3, wherein a flat layer is also disposed between the insulating layer and the touch electrode structure.

5. The in cell touch panel according to claim 2, wherein the touch electrode structure comprises a touch sensing electrode and a touch driving electrode insulated from each other.

6. The in cell touch panel according to claim 2, wherein the touch electrode structure comprises a plurality of self-capacitive electrodes insulated from one another, and a plurality of wires correspondingly connected to said plurality of self-capacitive electrodes.

7. The in cell touch panel according to claim 2, wherein the organic light emitting structure comprises an anode layer, a light-emitting layer and a cathode layer that are stacked up, and wherein the touch electrode structure comprises a first touch electrode, and the anode layer is multiplexed as a second touch electrode.

8. The in cell touch panel according to claim 7, wherein the first touch electrode is a touch sensing electrode, and the second touch electrode is a touch driving electrode.

9. The in cell touch panel according to claim 7, wherein the first touch electrode is a touch driving electrode, and the second touch electrode is a touch sensing electrode.

10. The in cell touch panel according to claim 2, wherein the insulating layer is arranged to block water and oxygen, and to coat the organic light emitting structure.

11. The in cell touch panel according to claim 10, wherein the insulating layer is formed by atomic deposition.

12. The in cell touch panel according to claim 11, wherein the insulating layer is made of alumina.

13. The in cell touch panel according to claim 2, wherein the organic light emitting structure comprises an anode layer, a light-emitting layer and a cathode layer that are stacked up, and wherein the touch electrode structure comprises a first touch electrode, and the cathode layer is multiplexed as a second touch electrode.

14. The in cell touch panel according to claim 1, wherein the organic light emitting structure comprises an anode layer, a light-emitting layer and a cathode layer that are stacked up, and the touch electrode structure comprises a touch sensing electrode and a touch driving electrode.

15. The in cell touch panel according to claim 14, wherein the anode layer is multiplexed as the touch sensing electrode, and the cathode layer is multiplexed as the touch driving electrode.

16. The in cell touch panel according to claim 14, wherein the cathode layer is multiplexed as the touch sensing electrode and the anode layer is multiplexed as the touch driving electrode.

17. The in cell touch panel according to claim 1, wherein the organic light emitting structure comprises an anode layer, a light-emitting layer and a cathode layer that are stacked up, and the touch electrode structure comprises a plurality of self-capacitive electrodes insulated from one another and a plurality of wires correspondingly connected to said plurality of self-capacitive electrodes, and wherein the anode layer is multiplexed as the self-capacitive electrode.

18. A driving method for the in cell touch panel according to claim 1, said in cell touch panel being driven in a time-sharing manner in a period of one frame, said method comprises:

displaying by controlling the organic light emitting structure to emit light in a display phase; and determining a touch position by controlling the touch electrode structure in a touch phase.

19. A display device, comprising the in cell touch panel according to claim 1.

20. The in cell touch panel according to claim 1, wherein the organic light emitting structure comprises an anode layer, a light-emitting layer and a cathode layer that are stacked up, and the touch electrode structure comprises a plurality of self-capacitive electrodes insulated from one another and a plurality of wires correspondingly connected to said plurality of self-capacitive electrodes, and wherein the cathode layer is multiplexed as the self-capacitive electrode.

* * * * *